United States Patent
Fazelpour et al.

(10) Patent No.: US 9,514,966 B2
(45) Date of Patent: Dec. 6, 2016

(54) APPARATUS AND METHODS FOR SHIELDING DIFFERENTIAL SIGNAL PIN PAIRS

(71) Applicant: QUALCOMM Incorporated, San Diego, CA (US)

(72) Inventors: Siamak Fazelpour, San Diego, CA (US); Charles David Paynter, Encinitas, CA (US); Ryan David Lane, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/251,236

(22) Filed: Apr. 11, 2014

(65) Prior Publication Data

US 2015/0294945 A1 Oct. 15, 2015

(51) Int. Cl.
| | |
|---|---|
| H01L 23/58 | (2006.01) |
| H01L 21/48 | (2006.01) |
| H01L 23/552 | (2006.01) |
| H01L 23/66 | (2006.01) |
| H01R 13/6471 | (2011.01) |

(52) U.S. Cl.
CPC ......... H01L 21/4885 (2013.01); H01L 23/552 (2013.01); H01L 23/66 (2013.01); *H01L 2223/6638* (2013.01); *H01L 2924/1579* (2013.01); *H01L 2924/15312* (2013.01); *H01L 2924/15313* (2013.01); *H01R 13/6471* (2013.01)

(58) Field of Classification Search
CPC ........... H01L 23/49838; H01L 21/4885; H01L 23/552; H05K 1/0219; H01R 13/6471
See application file for complete search history.

(56) References Cited

U.S. PATENT DOCUMENTS

| | | | | |
|---|---|---|---|---|
| 6,486,405 | B2 * | 11/2002 | Lin | ....................... H01B 11/005 174/113 R |
| 6,641,411 | B1 * | 11/2003 | Stoddard | ........... H01L 23/49838 257/E23.07 |
| 7,407,413 | B2 | 8/2008 | Minich | |
| 7,843,033 | B2 | 11/2010 | Mondal et al. | |
| 7,887,379 | B2 * | 2/2011 | Kirk | ..................... H05K 1/0228 439/676 |
| 8,344,266 | B2 | 1/2013 | Bird et al. | |
| 2006/0266549 | A1 | 11/2006 | Lin et al. | |
| 2007/0212946 | A1 * | 9/2007 | Bert | ................... H01R 13/6469 439/676 |
| 2008/0135960 | A1 * | 6/2008 | Danno | .................. H01L 21/561 257/428 |

(Continued)

OTHER PUBLICATIONS

Siadat D., et al., "Pinout Optimization for 10 Gbps+ Serial Link Routing," 43rd International Symposium on Microelectronics, IMAPS 2010, pp. 588-592.

*Primary Examiner* — Kenneth Parker
*Assistant Examiner* — Bo Fan
(74) *Attorney, Agent, or Firm* — Muncy, Geissler, Olds & Lowe, P.C.

(57) ABSTRACT

The disclosure is related to pin layouts in a semiconductor package. One embodiment of the disclosure provides a rhombus shaped shared reference pin layout that isolates a set of differential pin pairs. The differential signal pin pairs are configured such that an axis formed by a vertical signal pin pair is orthogonal to and mutually bisecting an axis formed by a lateral signal pin pair.

15 Claims, 8 Drawing Sheets

(56) References Cited

U.S. PATENT DOCUMENTS

| | | | |
|---|---|---|---|
| 2010/0077363 A1* | 3/2010 | Catuogno | G06F 17/5068 716/132 |
| 2011/0203843 A1* | 8/2011 | Kushta | H05K 1/0219 174/377 |
| 2013/0278348 A1* | 10/2013 | Ye | H01P 1/227 333/5 |
| 2013/0288534 A1* | 10/2013 | Degner | H01R 12/721 439/630 |

* cited by examiner

| | xtalk[dB] for standard er=4.4 of plastic wrapper of socket | | |
|---|---|---|---|
| F[GHz] | Xtalk-diagonal shielding | Xtalk-parallel in rhombus gnd frame | Xtalk-orthogonal in rhombus gnd frame | Increase in isolation [dB] |
| 1.6 | -38.3 | -39.7 | -46.2 | 7.9 |
| 5 | -28.9 | -30.2 | -36.9 | 8.0 |
| Up to 15 | -24.1 | -25.1 | -32.6 | 8.5 |

FIG. 4

| xtalk[dB] for standard er=4.4 of plastic wrapper of socket | | | | |
|---|---|---|---|---|
| F[GHz] | Xtalk-diagonal shielding | Xtalk-parallel in rhombus gnd frame | Xtalk-orthogonal in rhombus gnd frame | Increase in isolation [dB] |
| 1.6 | -38.3 | -39.7 | -46.2 | 7.9 |
| 5 | -28.9 | -30.2 | -36.9 | 8.0 |
| Up to 15 | -24.1 | -25.1 | -32.6 | 8.5 |
| Xtalk[dB] for er=7.5 of plastic wrapper of socket | | | | |
| F[GHz] | Xtalk-diagonal shielding | Xtalk-parallel | Xtalk-orthogonal | Increase in isolation [dB] |
| 1.6 | -37.1 | -38.3 | -44.8 | 7.7 |
| 5 | -27.9 | -29.0 | -35.7 | 7.8 |
| Up to 15 | -24.0 | -24.9 | -32.6 | 8.6 |

| Return loss (RL) [dB] for er=4.4 of plastic wrapper of socket | | | | |
|---|---|---|---|---|
| F[GHz] | RL-diagonal shielding | RL-parallel in rhombus gnd frame | RL-orthogonal in rhombus gnd frame | Increase in loss [dB] |
| 1.6 | -32.5 | -34.4 | -29.5 | 4.9 |
| 5 | -22.7 | -24.4 | -19.7 | 4.7 |

| Return loss [dB] for er=7.5 of plastic wrapper of socket | | | | |
|---|---|---|---|---|
| F[GHz] | RL-diagonal shielding | RL-parallel in rhombus gnd frame | RL-orthogonal in rhombus gnd frame | Increase in loss [dB] |
| 1.6 | -38.7 | -40.3 | -37.7 | 2.6 |
| 5 | -31.2 | -33.1 | -29.8 | 3.3 |

FIG. 6

APPARATUS AND METHODS FOR SHIELDING DIFFERENTIAL SIGNAL PIN PAIRS

TECHNICAL FIELD

The disclosure relates to reference pin layouts in a semiconductor package. More particularly, the disclosure relates to a reference pin layout that provides shielding to a set of signal pin pairs.

BACKGROUND

Crosstalk has become a critical factor in limiting performance in semiconductor packages. This is particularly true in the case of packages with differential pin pairs. There are no good current solutions to this problem. In general, the package has to tolerate the existing crosstalk level for the socket and/or connector. This typically results in degraded performance or reduced routing lengths.

Highly isolated and yet very compact differential pair pinout is the goal of package pinout definitions for digital high speed applications. To address the requirement that in Gb/s digital signaling, isolation between differential pairs must be kept very high many concepts are developed but all of them significantly increase the pinout to achieve isolation. The most commonly used pinout pattern is the diagonal shielding in which the number of differential pairs between diagonal reference lines defines signal to reference ratio. To allow 1:1 ratio, only one differential pair is allowed between diagonal reference lines and still additional reference pins are needed between each diff pair to achieve the best isolation between them, which is often expensive.

Accordingly, there are long-felt industry needs for apparatus and methods that improve upon conventional methods including the improved methods and apparatus provided hereby.

The inventive features that are characteristic of the teachings, together with further objects and advantages, are better understood from the detailed description and the accompanying figures. Each of the figures is provided for the purpose of illustration and description only, and does not limit the present teachings.

SUMMARY

The following presents a simplified summary relating to one or more aspects and/or embodiments associated with the apparatus and methods disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the apparatus and methods disclosed herein in a simplified form to precede the detailed description presented below.

In one embodiment of the disclosure, a rhombus shaped reference pinout configuration with two embedded perpendicularly oriented differential pairs is presented that allows for maximum isolation between differential pairs inside one rhombus and between neighbor rhombus units and with a minimum number of pins that achieves 1:1 ratio of signal to reference ratio with less number of pins than conventional diagonal shielding. Perpendicular orientation prevents magnetic coupling between embedded differential pairs. The Rhombus shaped shell prevents proximity between other differential pairs.

Another embodiment of the disclosure provides perpendicularly oriented embedded differential pair pins in a rhombus shaped reference pinout configuration to highly isolate differential pairs with a minimum number of pins.

Other objects and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which:

FIG. 4 illustrates exemplary isolation measurements in pinout crosstalk in accordance with some aspects of the disclosure.

FIG. 6 illustrates exemplary return loss measurements in pinout crosstalk in accordance with some aspects of the disclosure.

Figure 1A:
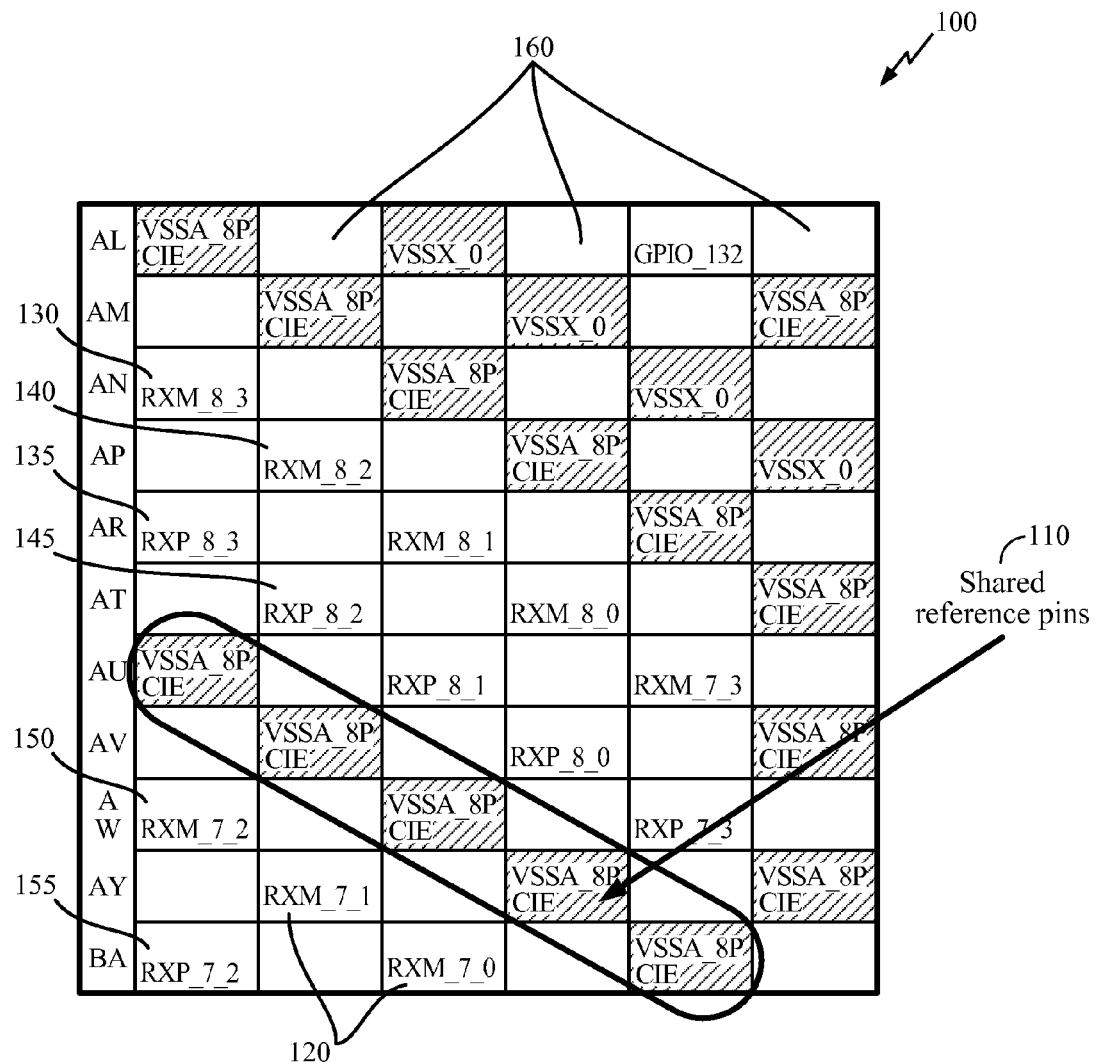
FIG. 1A illustrates a conventional pinout architecture.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Various aspects are disclosed in the following description and related drawings to show specific examples relating to exemplary embodiments of the disclosure. Alternate embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein describes particular embodiments only and should not be construed to limit any embodiments disclosed herein. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Further, many aspects are described in terms of sequences of actions to be performed by, for example, elements of a computing device. It will be recognized that various actions described herein can be performed by specific circuits (e.g., an application specific integrated circuit (ASIC)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action. Some embodiments of the inventions relate to crosstalk cancellation and/or to crosstalk reduction.

Some embodiments include a first differential signal pair and a second differential signal pair. The first and second differential signal pairs are arranged relative to each other in a manner to intentionally reduce or cancel crosstalk introduced by a pinout (for example, a section of a pinout, a socket, a section of a socket, a connector, a section of a connector, a socket and a connector, or a section of a socket and a connector, etc.) into at least one of the first differential signal pair and the second differential signal pair.

In some embodiments, a first pinout has a pin arrangement of a plurality of differential signal pairs, and a second pinout has a pin arrangement of a plurality of differential signal pairs. The first pinout and the second pinout are near each other and the pin arrangement of the first pinout and the pin arrangement of the second pinout are arranged to reduce or cancel crosstalk According to some embodiments, crosstalk cancellation is implemented for differential pairs of a differential bus. In some embodiments, crosstalk is cancelled for a high speed serial link, a high speed serial bus, a high speed differential bus, etc. (for example, in some embodiments a bus or link such as QPI or QuickPath Interconnect, PCI Express or Peripheral Component Interconnect Express, SMI or System Management Interrupt, SATA or Serial Advanced Technology Attachment, USB or Universal Serial Bus, etc.).

Figure 1B:
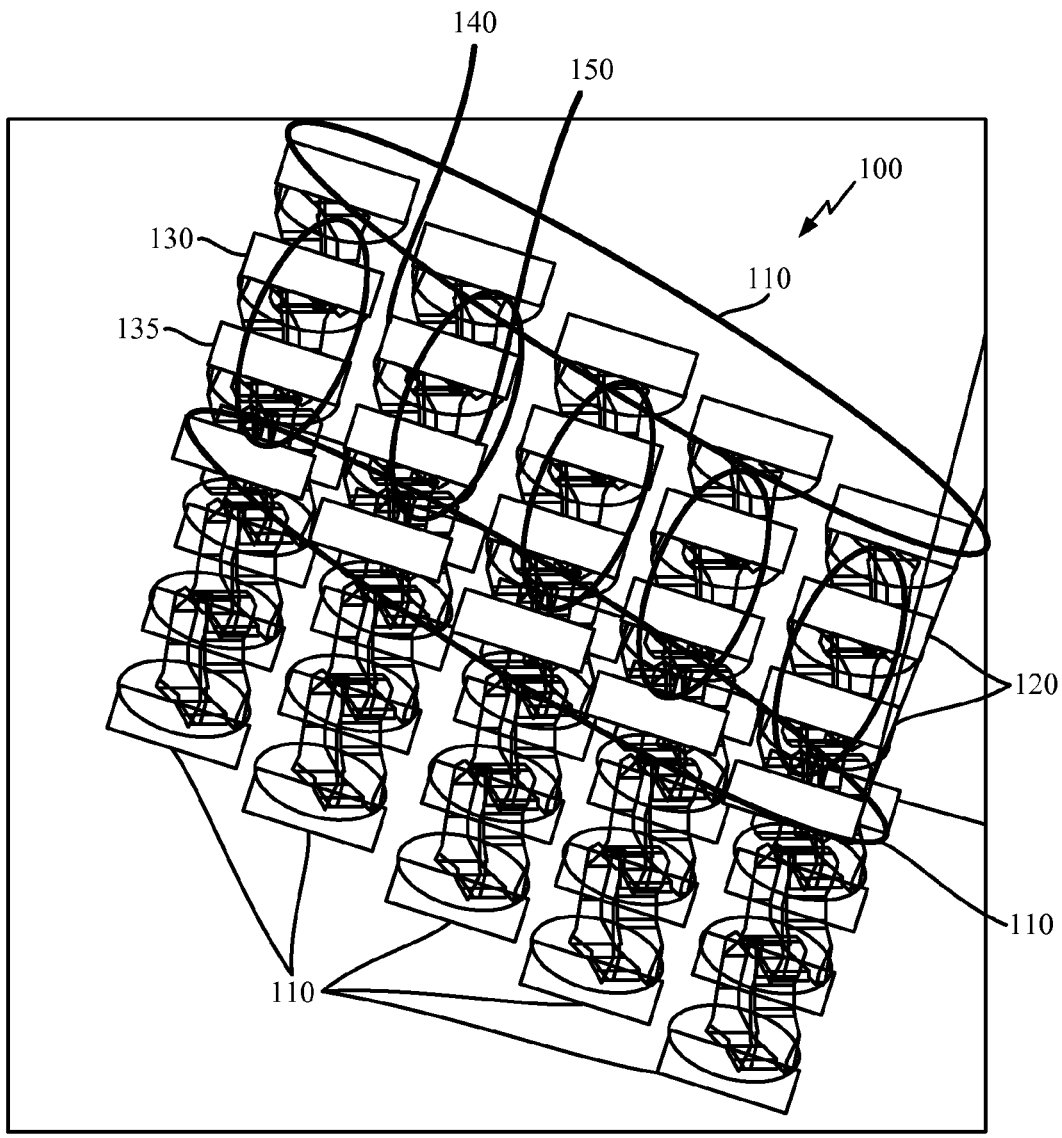
FIG. 1B illustrates a graphical representation of a conventional pinout architecture.

A conventional reference pin layout is illustrated in FIGS. 1A and 1B. FIG. 1A shows a portion of a socket 100 that includes shared reference pins 110 and signal pins 120. As shown in socket 100, signal pins 130 and 135 form a vertical signal pair. Similarly signal pins 140 and 145 form another vertical signal pair. The various signal pin pairs are arranged laterally or side by side in parallel with a slight vertical offset. The shared reference pins are arranged in a diagonal pattern that separates or isolates vertically aligned signal pin pairs from each other but not the laterally separated signal pairs. For example, shared reference pins 110 separate or isolate signal pin pair 130/135 from signal pin pair 150/155 but shared reference pins 110 do not separate or isolate signal pin pair 130/135 from signal pin pair 140/145. Socket 100 can also include a plastic wrapper or packaging 160 that provides structural integrity as well as an appropriate impedance for signal pins. The appropriate impedance is provided by the dielectric constant of the plastic or polymer wrapper or packaging. The typical plastic or polymer resin wrapper or packaging has a dielectric constant (Er) of about 4.4.

FIG. 1B illustrates a three dimensional view of socket 100. Socket 100 includes shared reference pins 110 and signal pins 120. As shown in socket 100, signal pins 130 and 135 form a vertical signal pair. Similarly signal pins 140 and 145 form another vertical signal pair. The various signal pin pairs are arranged laterally or side by side in parallel with a slight vertical offset. The shared reference pins are arranged in a diagonal pattern that separates or isolates vertically aligned signal pin pairs from each other but not the laterally separated signal pairs. Socket 100 can also include a plastic wrapper or packaging (not shown in FIG. 1B) that provides structural integrity as well as an appropriate impedance for signal pins.

Figure 2A:
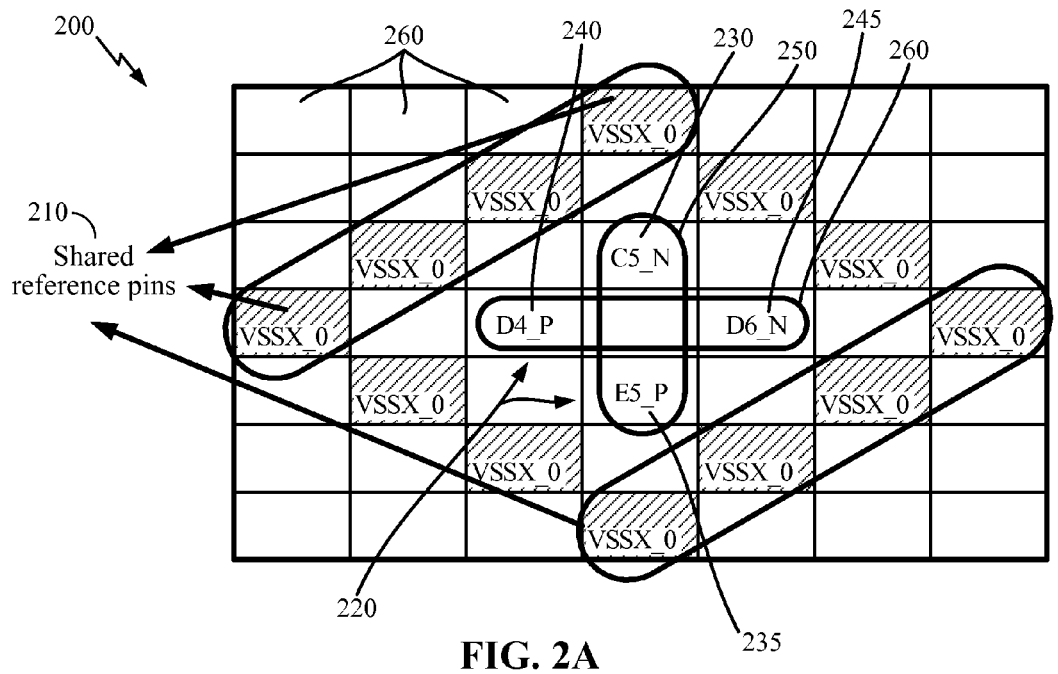
FIG. 2A illustrates an exemplary pinout architecture in accordance with some aspects of the disclosure.

FIG. 2A illustrates an exemplary embodiment of the disclosure. In FIG. 2A, a portion of a socket 200 includes shared reference pins 210 and signal pins 220. As shown in socket 200, signal pins 230 and 235 form a vertical differential signal pair. Similarly signal pins 240 and 245 form a lateral differential signal pair. The axis 250 formed by signal pins 230 and 235 is perpendicular or orthogonal to the axis 260 formed by signal pins 240 and 245. This arrangement aligns the axis of each differential pair in a perpendicular or orthogonal bisecting manner, which results in reduced crosstalk between the differential signal pairs 230/235 and 240/245. By arranging two signal pairs in a mutually perpendicular or orthogonal bisecting manner, the magnetic crosstalk disturbance between signal pairs is also reduced or eliminated. The shared reference pins 210 are arranged in a rhombus or parallelogram pattern surrounding the orthogonal signal pairs 230/235 and 240/245. The shared reference pins 210 provide a grounding shield or cage around the orthogonal signal pairs 230/235 and 240/245 that separates or isolates groups of orthogonal signal pin pairs from each other (not shown in FIG. 2). Socket 200 can also include a plastic wrapper or packaging 260 that provides structural integrity as well as appropriate impedance for signal pins. The appropriate impedance is provided by the dielectric constant of the plastic or polymer wrapper or packaging. The typical plastic or polymer resin wrapper or packaging has a dielectric constant (Er) of about 4.4. As will be discussed below however, increasing the dielectric constant slightly beyond 4.4 will improve the impedance or reduce the return loss of signals.

Figure 2B:
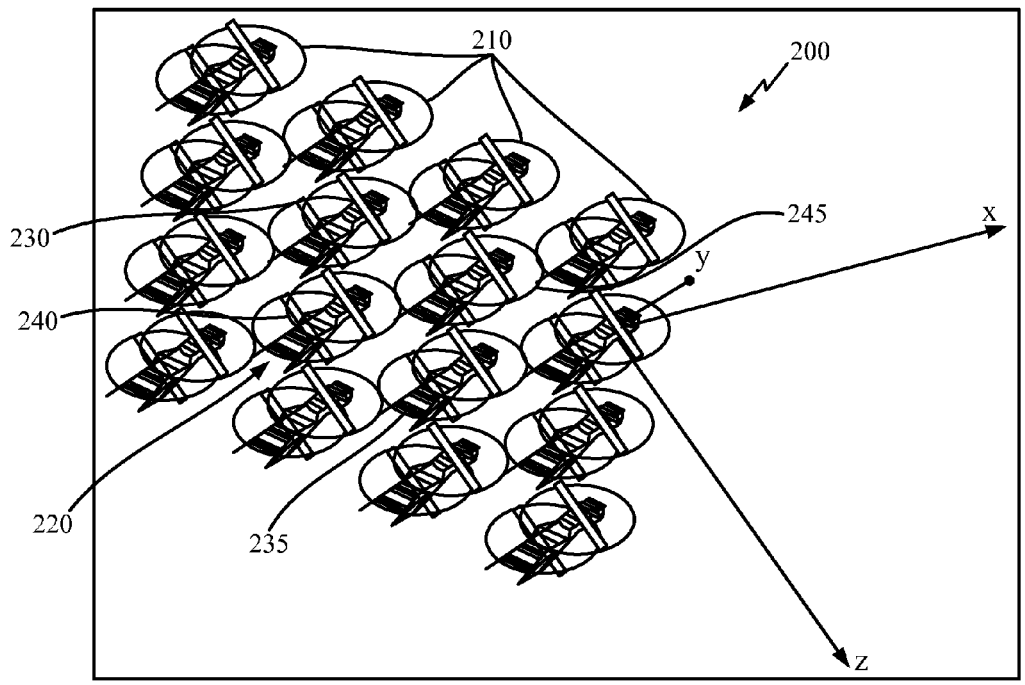
FIG. 2B illustrates a graphical representation of an exemplary pinout architecture in accordance with some aspects of the disclosure.

FIG. 2b illustrates a three dimensional representation of an exemplary embodiment of the disclosure. In FIG. 2B, a portion of a socket 200 includes shared reference pins 210 and signal pins 220. As shown in socket 200, signal pins 230 and 235 form a first differential signal pair. Similarly signal pins 240 and 245 form a second differential signal pair. The axis 250 formed by signal pins 230 and 235 is perpendicular or orthogonal to the axis 260 formed by signal pins 240 and 245. This arrangement aligns the axis of each differential pair in a perpendicular or orthogonal bisecting manner, which results in reduced crosstalk between the differential signal pairs 230/235 and 240/245. By arranging two signal pairs in a mutually perpendicular or orthogonal bisecting manner, the crosstalk disturbance between signal pairs is also reduced or eliminated. The shared reference pins 210 are arranged in a rhombus or parallelogram pattern surrounding the orthogonal signal pairs 230/235 and 240/245. The shared reference pins 210 provide a grounding shield or cage around the orthogonal signal pairs 230/235 and 240/245 that separates or isolates groups of orthogonal signal pin pairs from each other (not shown in FIG. 2). Socket 200 can also include a plastic wrapper or packaging (not shown) that provides structural integrity as well as an appropriate impedance for signal pins. Improvement in impedance is provided by the dielectric constant of the plastic or polymer wrapper or packaging. The typical plastic or polymer resin wrapper or packaging has a dielectric constant (Er) of about 4.4. As will be discussed below however, increasing the dielectric constant slightly beyond 4.4 will improve the impedance or reduce the return loss of signals.

Figure 3:
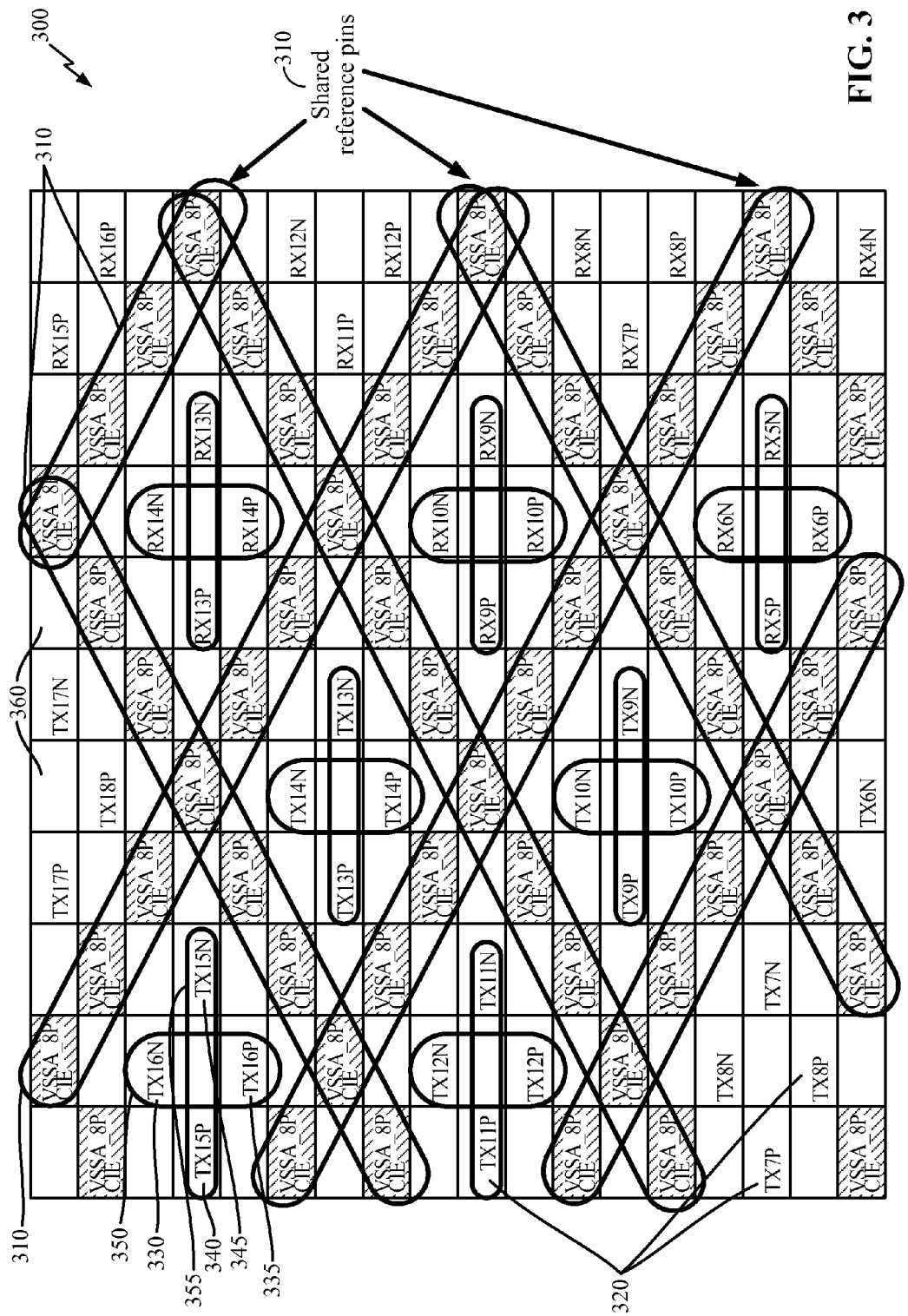
FIG. 3 illustrates a portion of an exemplary socket pinout architecture in accordance with some aspects of the disclosure.

FIG. 3 illustrates an exemplary embodiment of the disclosure. In FIG. 3, a portion of a socket 300 includes shared reference pins 310 and signal pins 320. As shown in socket 300, the signal pins 320 are configured in differential pairs. For example, signal pins 330 and 335 form a vertical differential signal pair. Similarly signal pins 340 and 345 form a lateral or horizontal differential signal pair. The axis 350 formed by signal pins 330 and 335 is perpendicular or orthogonal to and bisects the axis 355 formed by signal pins 340 and 345. This arrangement aligns the axis of each differential pair in a perpendicular or orthogonal bisecting manner, which results in reduced crosstalk between the differential signal pairs 330/335 and 340/345. By arranging two signal pairs in a mutually perpendicular or orthogonal bisecting manner, the magnetic crosstalk disturbance between signal pairs is also reduced or eliminated. The shared reference pins 310 are arranged in a rhombus or parallelogram pattern surrounding the orthogonal signal pairs 330/335 and 340/345. The shared reference pins 310 provide a grounding shield or cage around the orthogonal signal pairs 330/335 and 340/345 that separates or isolates groups of orthogonal signal pin pairs from each other. Socket 300 can also include a plastic wrapper or packaging 360 that provides structural integrity as well as an appropriate impedance for signal pins. The appropriate impedance is provided by the dielectric constant of the plastic or polymer wrapper or packaging. The typical plastic or polymer resin wrapper or packaging has a dielectric constant (Er) of about 4.4. As will be discussed below however, increasing the dielectric constant slightly beyond 4.4 will improve the impedance or reduce the return loss of signals.

FIG. 4 illustrates sample isolation decreases according to some illustrative embodiments of the disclosure. In FIG. 4, the isolation response of a differential signal pair is measured at three frequencies—1.6 GHz (row 410), 5 GHz (row 420), and up to 15 GHz (row 430). The response is based on the responses when using plastic or polymer wrapper with a dielectric constant of Er=4.4. Column 440 shows the crosstalk response when using the conventional diagonal shielding configuration of reference pins and the vertical differential signal pairs are aligned in parallel with vertical offset. Column 450 shows the crosstalk response when using a rhombus reference pin configuration in accordance with some embodiments of the disclosure and the vertical differential signal pairs are aligned in parallel with a vertical offset. Column 460 shows the crosstalk response when using a rhombus reference pin configuration in accordance with some embodiments of the disclosure and the differential signal pairs are configured to have perpendicular or orthogonal and mutually bisecting axis. Column 470 shows the decibel increase in crosstalk isolation between the results in column 440 and column 460.

Figure 5:
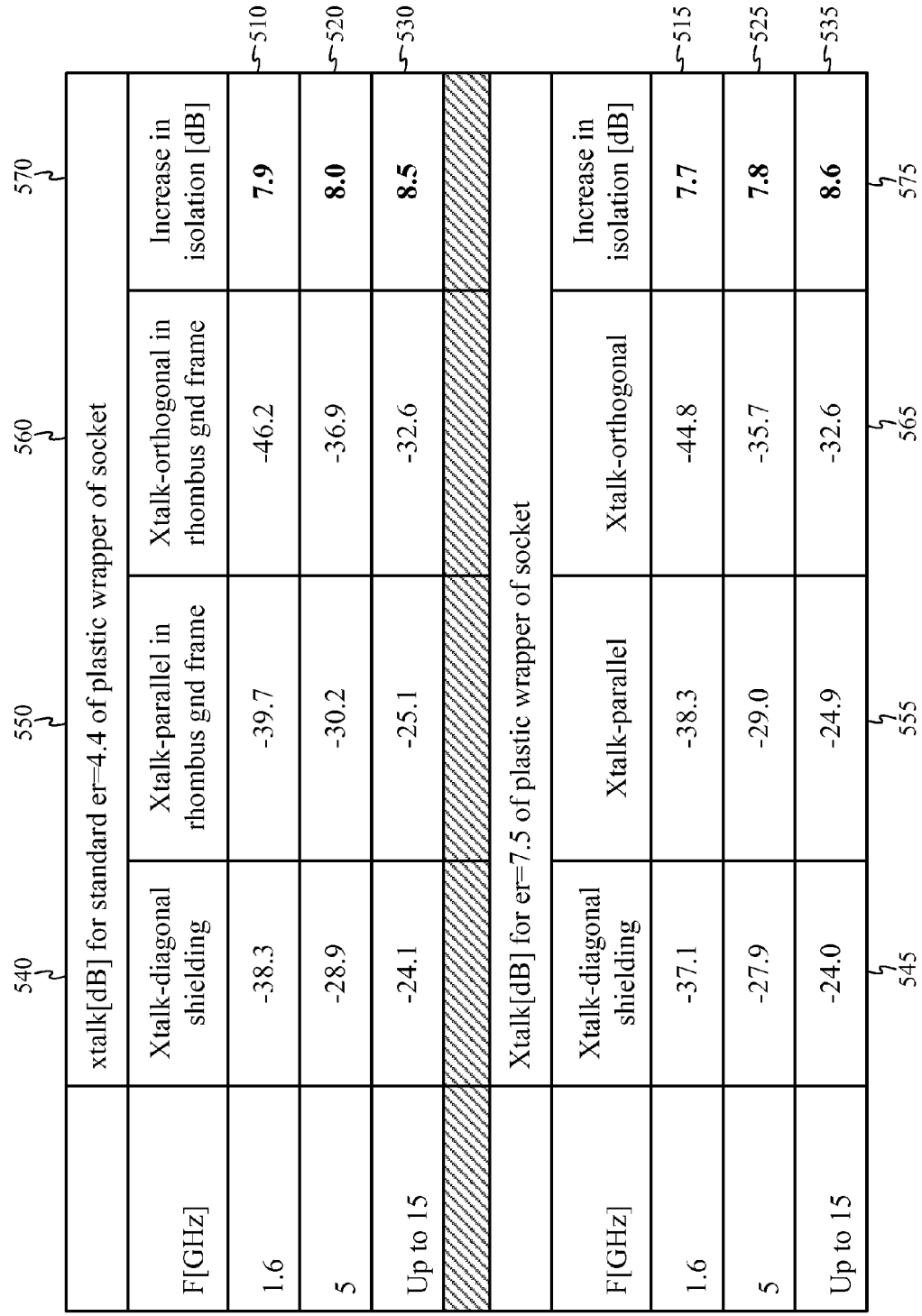
FIG. 5 illustrates exemplary isolation measurements in pinout crosstalk in accordance with some aspects of the disclosure.

FIG. 5 illustrates two sample sets of isolation decreases according to some illustrative embodiments of the disclosure. In FIG. 5, the first set of isolation responses of a differential signal pair is measured at three frequencies—1.6 GHz (row 510), 5 GHz (row 520), and up to 15 GHz (row 530). The response is based on the responses when using plastic or polymer wrapper with a dielectric constant of Er=4.4. Column 540 shows the crosstalk response when using the conventional diagonal shielding configuration of reference pins and the vertical differential signal pairs are aligned in parallel with vertical offset. Column 550 shows the crosstalk response when using a rhombus reference pin configuration in accordance with some embodiments of the disclosure and the vertical differential signal pairs are aligned in parallel with a vertical offset. Column 560 shows the crosstalk response when using a rhombus reference pin configuration in accordance with some embodiments of the disclosure and the differential signal pairs are configured to have perpendicular or orthogonal and mutually bisecting axis. Column 570 shows the decibel increase in crosstalk isolation between the results in column 540 and column 560.

In FIG. 5, the second set of isolation responses of a differential signal pair is measured at three frequencies—1.6 GHz (row 515), 5 GHz (row 525), and up to 15 GHz (row 535). The response is based on the responses when using plastic or polymer wrapper with a dielectric constant of Er=7.5. Column 545 shows the crosstalk response when using the conventional diagonal shielding configuration of reference pins and the vertical differential signal pairs are aligned in parallel with vertical offset. Column 555 shows the crosstalk response when using a rhombus reference pin configuration in accordance with some embodiments of the disclosure and the vertical differential signal pairs are aligned in parallel with a vertical offset. Column 565 shows the crosstalk response when using a rhombus reference pin configuration in accordance with some embodiments of the disclosure and the differential signal pairs are configured to have perpendicular or orthogonal and mutually bisecting axis. Column 575 shows the decibel increase in crosstalk isolation between the results in column 545 and column 565.

FIG. 6 illustrates two sample sets of return loss increases according to some illustrative embodiments of the disclosure. In FIG. 6, the first set of return loss responses of a differential signal pair is measured at two frequencies—1.6 GHz (row 610) and 5 GHz (row 620). The response is based on the responses when using plastic or polymer wrapper with a dielectric constant of Er=4.4. Column 640 shows the return loss response when using the conventional diagonal shielding configuration of reference pins and the vertical differential signal pairs are aligned in parallel with vertical offset. Column 650 shows the return loss response when using a rhombus reference pin configuration in accordance with some embodiments of the disclosure and the vertical differential signal pairs are aligned in parallel with a vertical offset. Column 660 shows the return loss response when using a rhombus reference pin configuration in accordance with some embodiments of the disclosure and the differential signal pairs are configured to have perpendicular or orthogonal and mutually bisecting axis. Column 670 shows the decibel decrease in return loss isolation between the results in column 640 and column 660.

In FIG. 6, the second set of return loss responses of a differential signal pair is measured at two frequencies—1.6 GHz (row 615) and 5 GHz (row 625). The response is based on the responses when using plastic or polymer wrapper with a dielectric constant of Er=7.5. Column 645 shows the return loss response when using the conventional diagonal shielding configuration of reference pins and the vertical differential signal pairs are aligned in parallel with vertical offset. Column 655 shows the return loss response when using a rhombus reference pin configuration in accordance with some embodiments of the disclosure and the vertical differential signal pairs are aligned in parallel with a vertical offset. Column 665 shows the return loss response when using a rhombus reference pin configuration in accordance with some embodiments of the disclosure and the differential signal pairs are configured to have perpendicular or orthogonal and mutually bisecting axis. Column 675 shows the decibel decrease in return loss isolation between the results in column 645 and column 665.

In some of the embodiments of the disclosure, the perpendicular orientation prevents magnetic coupling between embedded differential signal pin pairs. A rhombus shaped shell prevents proximity between other differential pairs and provides both electric and magnetic isolation between differential pairs in adjacent cages.

Figure 7:
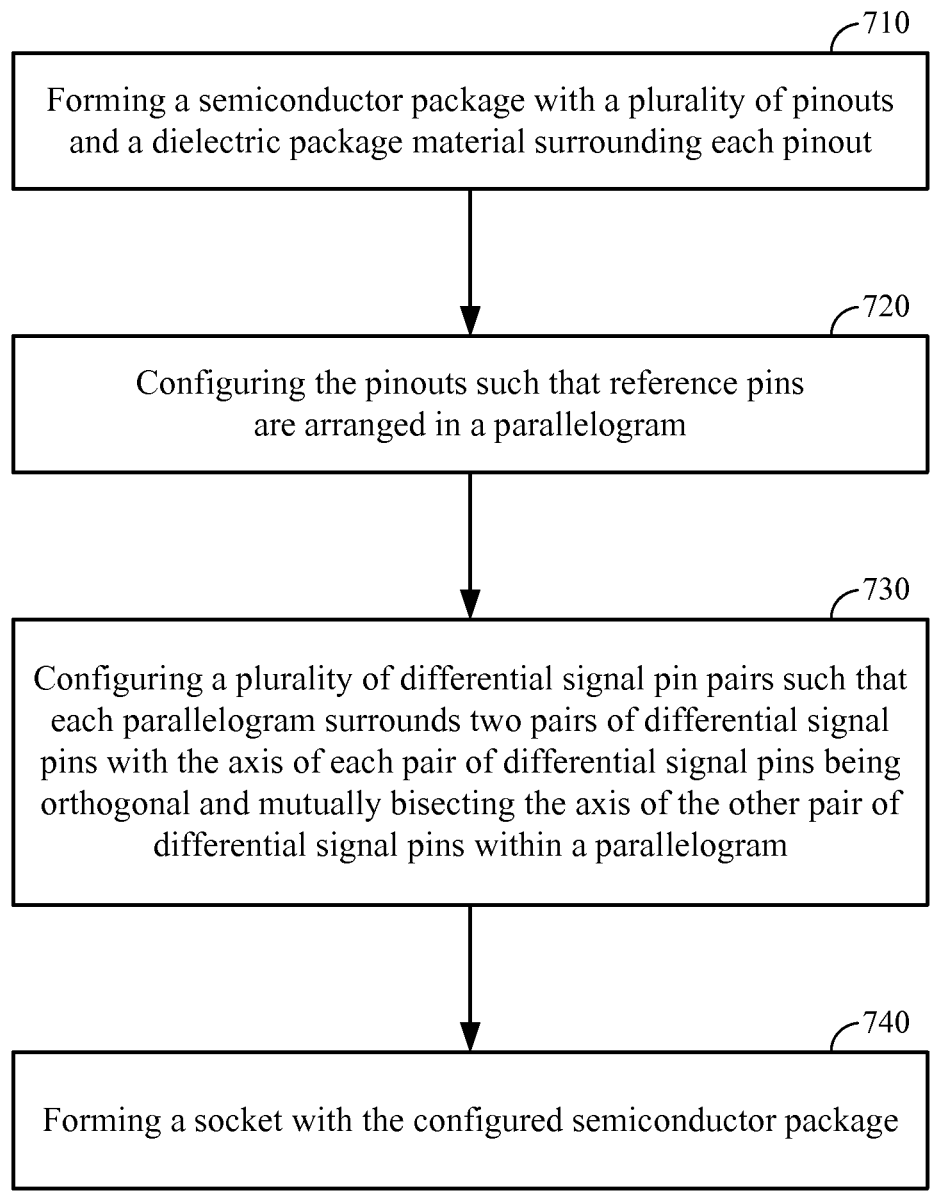
FIG. 7 illustrates an exemplary flowchart for constructing a pinout configuration in accordance with some aspects of the disclosure.

FIG. 7 illustrates a method for manufacturing a socket according to some embodiments of the disclosure. In FIG. 7, a first step 710 includes forming a semiconductor package with a plurality of pinouts and a dielectric package material surrounding each pinout. Next, step 720 includes configuring the pinouts such that reference pins are arranged in a parallelogram. Next, step 730 includes configuring a plurality of differential signal pin pairs such that each parallelogram surrounds two pairs of differential signal pins with the axis of each pair of differential signal pins being orthogonal and mutually bisecting the axis of the other pair of differential signal pins within a parallelogram. Last, step 740 includes forming a socket with the configured semiconductor package.

The pinout configuration of some embodiments of the disclosure may be configured to form sockets for use in high speed digital applications such as servers, mobile devices, PC, tablets, laptop and notebooks.

According to some embodiments of the disclosure, the differential pin pairs are spaced in a 60 degree interstitial pin pattern, lateral differential pairs are 73% farther away than vertical differential pairs, which affects return loss. The differential pair with farther away pins has a higher return loss compared to the differential pair with closer positive and negative LGA pads. However, the difference may be reduced by increasing the dielectric constant of the plastic wrapper from 4.4 to 7.5, which has almost no effect on crosstalk, since electric coupling of a differential pair to its reference pins and its neighbor orthogonal differential pair increases proportionally, but improves return loss significantly since it increases the capacitance and hence reduces the impedance of pins towards, for example, 50 ohms.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those skilled in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted to depart from the scope of the present disclosure.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some exemplary embodiments, some or a plurality of the most important method steps can be performed by such an apparatus.

The exemplary embodiments described above merely constitute an illustration of the principles of the present invention. It goes without saying that modifications and variations of the arrangements and details described herein will become apparent to other persons skilled in the art. Therefore, it is intended that the invention be restricted only by the scope of protection of the appended patent claims, rather than by the specific details presented on the basis of the description and the explanation of the exemplary embodiments herein.

In the detailed description above it can be seen that different features are grouped together in exemplary embodiments. This manner of disclosure should not be understood as an intention that the claimed exemplary embodiments require more features than are explicitly mentioned in the respective claim. Rather, the situation is such that inventive content may reside in fewer than all features of an individual exemplary embodiment disclosed. Therefore, the following claims should hereby be deemed to be incorporated in the description, wherein each claim by itself can stand as a separate exemplary embodiment. Although each claim by itself can stand as a separate exemplary embodiment, it should be noted that—although a dependent claim can refer in the claims to a specific combination with one or a plurality of claims—other exemplary embodiments can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some exemplary embodiments, an individual step/action can be subdivided into a plurality of sub-steps or contain a plurality of sub-steps. Such sub-steps can be contained in the disclosure of the individual step and be part of the disclosure of the individual step.

While this disclosure describes exemplary embodiments, it should be noted that various changes and modifications could be made herein without departing from the scope of the invention as defined by the appended claims.

What is claimed is:

1. An apparatus comprising:
    a reference pin shield configured in a rhombus shape;
    a first differential signal pin pair within the reference pin shield, the first differential signal pin pair forming a first axis; and
    a second differential signal pin pair within the reference pin shield, the second differential signal pin pair forming a second axis;
    wherein a positive polarity signal of the first differential pair and a positive polarity signal of the second differential pair are nearer to each other than any other signals of the first differential pair and the second differential pair;
    wherein the first and second differential signal pin pairs are configured such that the first axis is orthogonal relative to the second axis and wherein a first pin of the first differential signal pin pair is closer to a second pin of the first differential signal pin pair than a first pin of the second differential signal pin pair is from a second pin of the second differential signal pin pair.

2. The apparatus of claim 1, wherein the first differential signal pin pair is arranged relative to the second differential signal pin pair in a manner to intentionally reduce or cancel crosstalk introduced by a pinout into at least one of the first differential signal pin pair and the second differential signal pin pair.

3. The apparatus of claim 1, further comprising a plurality of reference pin shields, each of the plurality of reference pin shields isolating a region of the apparatus.

4. The apparatus of claim 3, further comprising a plurality of first and second differential signal pin pairs, each of the plurality of first and second differential signal pin pairs being located within one of the plurality of reference pin shields.

5. The apparatus of claim 1, further comprising routing in a negative polarity signal of the first differential signal pin pair and a positive polarity signal of the first differential signal pin pair nearer to each other than any other signals of the second differential signal pin pair.

6. The apparatus of claim 1, wherein a negative polarity signal of the first differential signal pin pair is closer to a positive polarity signal of the first differential signal pin pair than a negative polarity signal of the second differential signal pin pair is to a positive polarity signal of the second differential signal pin pair.

7. The apparatus of claim 1, wherein the positive polarity signal of the first differential signal pair is closer to the second differential signal pair than the negative polarity signal of the first differential signal pair, and wherein the positive polarity signal of the second differential signal pair is closer to the first differential signal pair than the negative polarity signal of the second differential signal pair.

8. An apparatus comprising:
    means for shielding a plurality of differential signals configured in a rhombus shape;
    means for receiving a first differential signal, the first differential signal means forming a first axis; and
    means for receiving a second differential signal, the second differential signal means forming a second axis;
    wherein a positive polarity signal of the first differential signal means and a positive polarity signal of the second differential signal means are nearer to each other than any other signals of the first differential signal means and the second differential signal means;

wherein the first and second differential signal means are configured such that the first axis is orthogonal relative to the second axis and wherein a first pin of the first differential signal pin pair is closer to a second pin of the first differential signal pin pair than a first pin of the second differential signal pin pair is from a second pin of the second differential signal pin pair.

9. The apparatus of claim 8, wherein the first differential signal means is arranged relative to the second differential signal means in a manner to intentionally reduce or cancel crosstalk introduced by a pinout into at least one of the first differential signal means and the second differential signal means.

10. The apparatus of claim 8, further comprising a plurality of shield means, each of the plurality of shield means isolating a region of the apparatus.

11. The apparatus of claim 10, further comprising a plurality of first and second differential signal means, each of the plurality of first and second differential signal means being located within one of the plurality of shield means.

12. A method for forming a pinout socket comprising:
    forming a semiconductor package, the semiconductor package having a plurality of pinouts;
    configuring a reference portion of the plurality of pinouts in a rhombus shape;
    configuring a signal portion of the plurality of pinouts, the signal portion being configured to form a first differential signal pin pair and a second differential pin pair within the reference portion, wherein a first pin of the first differential signal pin pair is closer to a second pin of the first differential signal pin pair than a first pin of the second differential signal pin pair is from a second pin of the second differential signal pin pair;
    configuring a positive polarity signal of the first differential pair and a positive polarity signal of the second differential pair nearer to each other than any other signals of the first differential pair and the second differential pair; and
    forming the pinout socket.

13. The method of claim 12, further comprising configuring the reference portion in a rhombus shape.

14. The method of claim 12, further comprising configuring the signal portion to such that the first differential signal pin pair has an axis orthogonal and mutually bisecting an axis of the second differential signal pin pair.

15. The method of claim 12, further comprising configuring a plurality of reference portions, each plurality of reference portions shielding two pairs of differential signal pin pairs.

* * * * *